United States Patent [19]

Hemminger et al.

[11] Patent Number: 5,294,890

[45] Date of Patent: Mar. 15, 1994

[54] EXAMINATION CIRCUIT FOR A SENSOR

[75] Inventors: Hermann Hemminger, Markgroeningen; Stephan Johne, Ludwigsburg, both of Fed. Rep. of Germany

[73] Assignee: Robert Bosch GmbH, Stuttgart, Fed. Rep. of Germany

[21] Appl. No.: 971,867

[22] PCT Filed: Apr. 24, 1992

[86] PCT No.: PCT/DE92/00327

§ 371 Date: Jan. 19, 1993

§ 102(e) Date: Jan. 19, 1993

[87] PCT Pub. No.: WO92/21985

PCT Pub. Date: Dec. 10, 1992

[30] Foreign Application Priority Data

Jun. 7, 1991 [DE] Fed. Rep. of Germany ....... 4118718

[51] Int. Cl.$^5$ ............................................. G01R 31/02
[52] U.S. Cl. ................................. 324/549; 324/718; 340/650; 340/652; 340/514; 374/142; 204/401
[58] Field of Search ............... 324/537, 549, 525, 601, 324/718; 340/514, 650, 651, 652; 374/142; 204/401

[56] References Cited

U.S. PATENT DOCUMENTS

| | | | |
|---|---|---|---|
| 3,883,753 | 5/1975 | Harrison | 340/650 |
| 3,973,184 | 8/1976 | Raber | 340/650 |
| 4,103,299 | 7/1978 | Swinehart | 340/650 |
| 4,647,920 | 3/1987 | Corso | 340/650 |
| 5,079,506 | 1/1972 | Choi | 324/549 |

FOREIGN PATENT DOCUMENTS

| | | |
|---|---|---|
| 3408960 | 9/1984 | Fed. Rep. of Germany . |
| 8910542 | 11/1989 | PCT Int'l Appl. . |
| 1577048 | 10/1980 | United Kingdom . |
| 1588667 | 4/1981 | United Kingdom . |

*Primary Examiner*—Kenneth A. Wieder
*Assistant Examiner*—Jose M. Solis
*Attorney, Agent, or Firm*—Michael J. Striker

[57] ABSTRACT

The monitoring circuit for a sensor connected to a low-potential and high-potential line, such as a thermal element, includes a high-resistance pulldown resistor connected between the high potential line and ground, a offset voltage source connected to the low-potential line to supply an offset voltage higher than a minimum transistor control voltage; first and second testing transistor shaving control electrodes connected to respective ones of the lines via resistor arrangements; and a third testing transistor having a control electrode connected to an output of a p-type channel FET having a control electrode connected to one of the two sensor lines. Whether the operating state of the sensor is normal, involves a short circuit to ground or the supply voltage or an interruption of the sensor lines is determined by monitoring the switching states of the first testing transistor and a series combination of the second and third testing transistor.

5 Claims, 1 Drawing Sheet

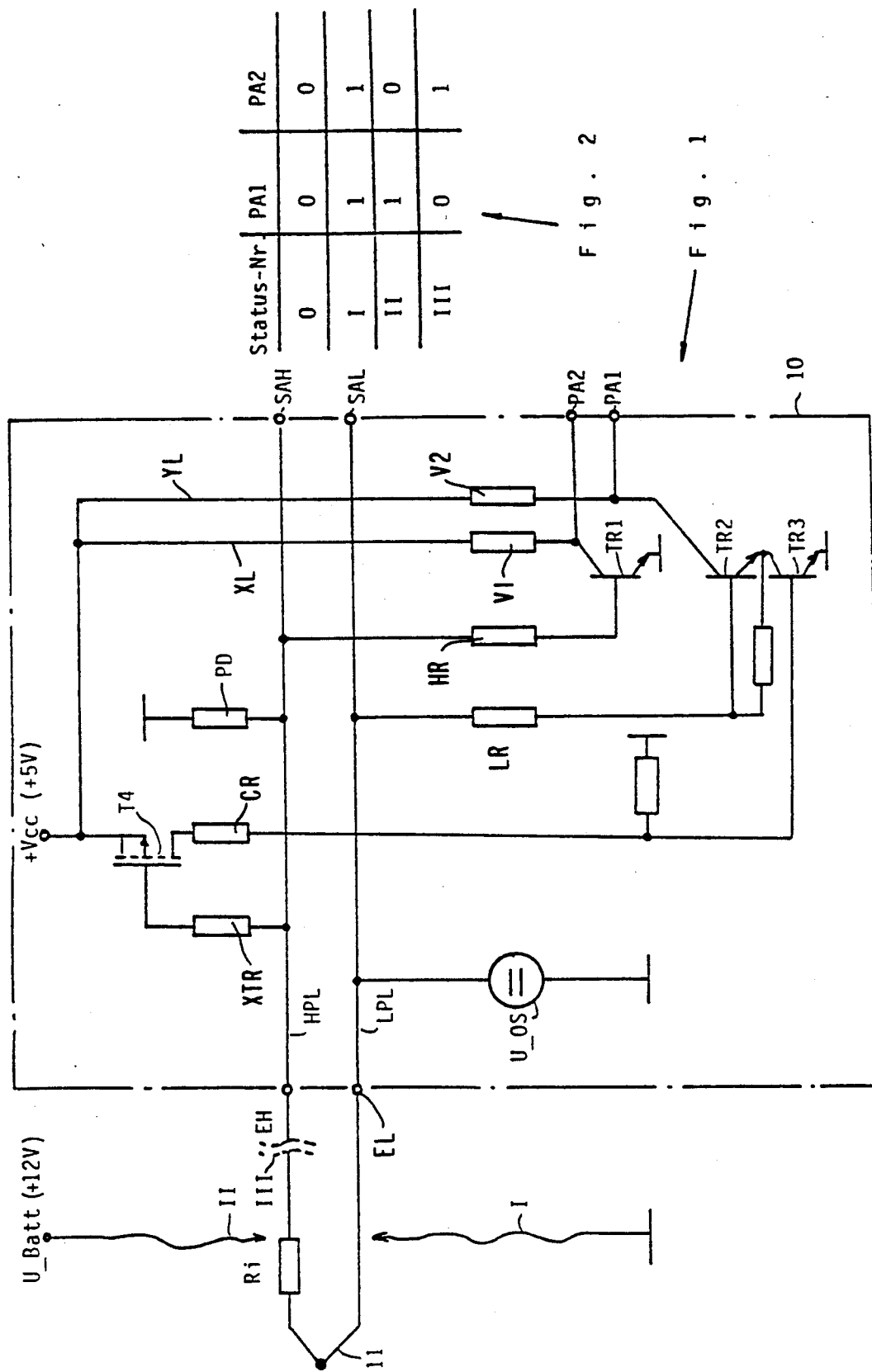

EXAMINATION CIRCUIT FOR A SENSOR

BACKGROUND OF THE INVENTION

The invention relates to a circuit for checking the operating state or status of a sensor. The sensor can either be operational or can transmit an erroneous signal which is caused in particular by a short circuit to ground, a short circuit to the supply voltage or by an interruption.

In the following, the expression "electron receiving electrode" is employed in connection with transistors, etc. This refers to the drain or collector in transistors with n-type conduction and to the source or emitter in transistors with p-type conduction.

Automatic status detection is particularly important for sensors which can only be observed and monitored at longer intervals of time or which supply their signals to fully-automated processing devices. In such cases it is standard to monitor operating parameters continuously and to generate binary status signals.

When checking the operation of a sensor it is desirable to be able to detect different operating states in the simplest manner possible. Accordingly, the problem arises of providing a testing or monitoring circuit for a sensor which makes it possible to distinguish between different operating states in a simple manner.

SUMMARY OF THE INVENTION

The monitoring circuit according to the invention for a sensor is characterized by:

an offset voltage source which is connected with that sensor line whose potential is lower (low-potential line) than that of the other line (high-potential line) and which supplies the low-potential line with an offset voltage relative to ground which is higher than the minimum voltage at the control electrode of a transistor so as to control the latter (minimum control voltage of transistor);

a pulldown resistor which is connected with the high-potential line on the one hand and to ground on the other hand;

a first testing transistor whose control electrode is connected with the high-potential line via a resistor arrangement and which blocks when the potential on the high-potential line falls below the minimum control voltage of the transistor, which occurs either because of a short circuit of the sensor to ground or due to the pulldown resistor during an interruption;

a second testing transistor whose control electrode is connected with the low-potential line via a resistor arrangement and which blocks when the low-potential line is grounded, which occurs during a short circuit to ground;

and a third testing transistor whose control electrode is connected with the output of a p-type transistor whose control electrode is connected with one of the two sensor lines and which is connected in such a way that it blocks when the lines have a potential which corresponds at least to the potential of the electron receiving electrode with respect to the minimum control voltage, whereupon the third testing transistor also blocks;

the combination of the switching states of the three testing transistors indicates the operating state of the sensor, that is distinguishes between operational, short circuit to ground, short circuit to supply voltage and interruption.

As a result of the aforementioned combinations of switching states of the three testing transistors, four sensor function states can be checked with only three transistor signals. The evaluation is even simpler when two or three testing transistors are connected in series according to a particularly preferred embodiment form. Even in this case the respective operating state of the sensor follows in a definite manner from the combinations of the switching states of the transistor series connection and the remaining testing transistor. If the blocking state of a transistor is designated by "1" and the switch-through state (connection to ground) is designated by "0", the four states can be distinguished from one another as 2-bit signals "00", "01", "10" and "11".

BRIEF DESCRIPTION OF THE DRAWINGS

The objects, features and advantages of the present invention will now be illustrated in more detail by the following detailed description, reference being made to the accompanying drawing, in which:

FIG. 1 is a circuit diagram of a preferred embodiment of a monitoring circuit for a sensor according to the invention which detects a total of four operating states of the sensor with the aid of two test signals each of which is in one of two states; and FIG. 2 is a table showing the relationship between the switching states of the first testing transistor and the combination of the second and third testing transistors and operating states of the sensor.

DESCRIPTION OF THE PREFERRED EMBODIMENTS

FIG. 1 shows a monitoring circuit 10 to which is connected a thermal element 11 as sensor via two inputs EL and EH. That line of the thermal element 11 whose potential is lower (low-potential line LPL) than that of the other line (high-potential line HPL) is connected with the input EL. The high-potential line is connected to the other input EH. The signals of these inputs are supplied via the high-potential line HPL or the low-potential line LPL directly to signal outputs SAH and SAL, respectively, where they are ready for further processing. On the other hand, the signals are evaluated on the two lines XL, YL within the monitoring circuit 10 and the evaluating signals are supplied to two testing outputs PA1 and PA2.

The following three errors in particular can occur at the thermal element 11: a short circuit to ground, which is designated by I in FIG. 1, a short circuit to the supply voltage, designated by II, and finally a line interrupter designated by III. The short circuits and line interruptions can occur on only one of the two sensor lines or on both.

It is assumed in the following that a battery voltage U—Batt of +12 V is the voltage of a voltage source and that a supply voltage+Vcc of +5 V is used by the transistors in the testing circuit 10.

It is essential for the operation of the testing circuit 10 that it has an offset voltage source U—OS which raises the potential of the low-potential line LPL relative to ground, specifically by an offset voltage which is higher than the minimum control voltage of the transistor. In the embodiment example according to FIG. 1, npn Si transistors with a base-emitter voltage drop of approximately 0.7 V are used. The offset voltage of 1 V was therefore selected in the embodiment example.

A pulldown resistor PD is connected between the high-potential line and ground. Since a current which leads to a voltage drop at the internal resistor R1 of the thermal element 11 constantly flows across this pulldown resistor PD, the value of the resistance is selected so as to be high enough so that the sensor signal is changed less than an amount corresponding to the measurement accuracy of the sensor Alternatively, the voltage drop at the internal resistor of the sensor could be taken into account when evaluating the sensor signal. However, this is only practical in applications in which the resistance of the internal resistor of the sensor as well as of the pulldown resistor is substantially constant with respect to time.

As long as the sensor functions properly the potential on the low-potential line LPL corresponds to the offset potential and the potential on the high-potential line is higher by an amount corresponding to the sensor voltage. In the case of an interruption, the potential on the high-potential line is pulled to ground potential by the pulldown resistor PD. Similarly, in the case of a ground short circuit of this line there is ground potential on the high-potential line. In the case of a ground short circuit of the low-potential line LPL, the latter is at ground potential and the potential on the high-potential line HPL is higher by an amount corresponding to the sensor voltage. On the other hand, if the ground line comes into contact with the high potential of the voltage source (battery) or also only with that of the supply voltage, it takes on the corresponding potential. The potential on the high-potential line is higher by an amount corresponding to the sensor voltage. On the other hand, if the high-potential line comes into contact with one of the two aforementioned higher potentials, it receives the respective higher potential, while the potential of the low-potential line LPL is lower by an amount corresponding to the sensor voltage. The differences in potential on the two lines in the case of short circuits to ground or the aforementioned higher potentials are negligible when the maximum sensor voltage is lower than the control voltage of the transistor. This is assumed in the embodiment example.

A transistor controlled by the potential of the high-potential line HPL is designated in FIG. 1 as TR1. Its base is connected with the high-potential line via a resistor arrangement which is shown as an individual resistor HR. Its collector is connected via a resistor V1 with the operating voltage Vcc and its emitter is connected to ground. The signal fed to a second testing output PA2 is tapped at the collector. It corresponds to the ground potential (state "0") as long as the transistor TR1 conducts, which is the case when the potential on the high-potential line is at least at the potential of the offset voltage source U_OS. On the other hand, if the potential falls below this value due to an interruption or a short circuit to ground, the transistor TR1 blocks and the aforementioned signal has the potential of the operating voltage (state "1").

In the same way that the transistor TR1 searches for the presence of a potential above or below the offset potential on the high-potential line, a transistor TR2 tests for these conditions on the low-potential line LPL. This transistor is also an npn Si transistor. Its base is connected with the low-potential line via a resistor arrangement. Its collector is connected to the operating voltage Vcc via a resistor V2. The signal at the collector is fed to a first testing output PA1. However, the emitter is not directly grounded as is that of the transistor TR1. Rather the switching path of a transistor TR3 is connected between it and ground. Therefore, the signal "0" does not occur already at the first testing output TR1 when the transistor TR2 switches through, rather this only happens when the transistor TR3 is also open. When one of these transistors blocks, the signal at the testing output PA1 has state "1".

The base of the aforementioned transistor TR3 is controlled by a transistor TR4 via a connecting resistor CR. This is a p-channel MOSFET whose source is connected to the supply voltage of +5 volts, whose gate is connected via a resistor XTR with the high-potential line HPL, and whose drain switches through the transistor TR3. This p-channel MOSFET is switched through as long as the potential at its gate, i.e. the potential of the high-potential line, is lower than the source potential, i.e. the supply voltage. Then the transistor TR3 is also switched through. However, this changes and the potential on the high-potential line increases at least to that of the supply voltage Vcc of +5 V, which is the case e.g. when there is a short circuit to the voltage of +12 V of the voltage source (battery). The supply voltage Vcc must be greater than the sum of output voltage of the sensor +offset voltage +minimum control voltage of the transistor TR4 for the transistor TR4 to switch properly in the above-mentioned case.

FIG. 2 illustrates the states of the signals at the testing outputs PA1 and PA2 for the operating states described above. It can be seen that the four different cases can be distinguished from one another in a definite manner with the aid of the two binary test signals.

In the embodiment example of FIG. 1, the transistor driving the base of the transistor TR3 is a field-effect transistor. The advantage of this is that it requires no control current which would have to flow across the pulldown resistor PD. The value of the pulldown resistor can accordingly be selected so as to be very high, which is advantageous for the measuring accuracy of the sensor signal for the reasons given above. However, if the testing circuit is to be integrated together with other circuit parts it is advantageous if all switching elements can be produced by substantially identical process steps, i.e. they are all either bipolar transistors or field-effect transistors. Depending on the application, the transistor TR4 is accordingly constructed as a field-effect transistor or as a bipolar pnp transistor. It is more advantageous to use field-effect transistors because of the considerably reduced leakage current and currentless control compared to bipolar transistors. The circuit of FIG. 1 is used in a corresponding manner. However, in the transistors TR1 to TR3 the source of the respective FETs corresponds to the emitter, the gate corresponds to the base, and the drain corresponds to the collector of the respective bipolar transistor. The offset voltage must be higher corresponding to the higher control voltage of FETs, e.g. 2.5 V instead of 1 V.

While the invention has been illustrated and embodied in a monitoring circuit for a sensor, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

We claim:
1. Monitoring circuit for a sensor comprising
   a high-potential line and a low-potential line, each of said lines being connected to said sensor;
   an offset voltage source (U_OS) connected to the low-potential line and producing an offset voltage relative to ground higher than a minimum transistor control voltage;
   a pulldown resistor connected between said high-potential line and said ground;
   a first testing transistor having a control electrode connected via a resistor arrangement with said high-potential line and said first testing transistor switching to a blocking state when a potential on the high-potential line drops below the minimum transistor control voltage due to one of a short circuit of the sensor to ground and an interruption of said lines;
   a second testing transistor having a control electrode connected with said low-potential line via another resistor arrangement and switching to a blocking state when the low-potential line is grounded as a result of a short circuit to ground; and
   a third testing transistor having a control electrode and a p-type transistor having a control electrode and an output connected with the control electrode of the third testing transistor, said control electrode of the p-type transistor being connected with one of said lines so that said p-type transistor is in a blocking state when said lines have a potential corresponding at least to a potential of an electron receiving electrode relative to the minimum control voltage, so that said third testing transistor enters a blocking state;
   wherein said three testing transistors have switching states and a combination of said switching states indicate one of a plurality of operating states of said sensor, said operating states including short circuit to ground, short circuit to supply voltage, normal operation and line interruption.

2. Monitoring circuit as defined in claim 1, wherein said second and third transistors each have a switching path and said switching paths of said second and said third transistors are connected with said switching paths in series and a combined switching state of the second and third transistors so connected and said switching state of the first testing transistor indicates said operating state.

3. Monitoring circuit as defined in claim 1, wherein said p-type transistor is a p-channel FET.

4. Monitoring circuit as defined in claim 2, wherein said p-type transistor is a p-channel FET.

5. Monitoring circuit as defined in claim 1, wherein the pulldown resistor (PD) has a resistance high enough so that a measured signal from said sensor is changed less than a measurement accuracy of said sensor by said pull down resistor during said normal operation.

* * * * *